(12) United States Patent
Han et al.

(10) Patent No.: US 7,888,670 B2
(45) Date of Patent: Feb. 15, 2011

(54) NITRIDE SEMICONDUCTOR LIGHT EMITTING DEVICE

(75) Inventors: Sang Heon Han, Gyunggi-do (KR);
Sang Won Kang, Gyunggi-do (KR);
Jeong Tak Oh, Gyunggi-do (KR);
Seung Beom Seo, Gyunggi-do (KR);
Dong Joon Kim, Gyunggi-do (KR);
Hyun Wook Shim, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 338 days.

(21) Appl. No.: 12/081,272

(22) Filed: Apr. 14, 2008

(65) Prior Publication Data

US 2008/0251781 A1 Oct. 16, 2008

(30) Foreign Application Priority Data

Apr. 16, 2007 (KR) .................. 10-2007-0037129

(51) Int. Cl.
*H01L 33/00* (2010.01)
(52) U.S. Cl. .................. 257/13; 257/18; 257/97; 257/E33.034
(58) Field of Classification Search .......... 257/13
See application file for complete search history.

(56) References Cited

U.S. PATENT DOCUMENTS 6,617,060 B2 * 9/2003 Weeks et al. ............... 428/698
7,193,246 B1 * 3/2007 Tanizawa et al. ............ 257/94
7,462,876 B2 * 12/2008 Han et al. .................. 257/96

FOREIGN PATENT DOCUMENTS

| JP | 8-070139 | 3/1996 |
|---|---|---|
| KR | 10-2004-0004605 A | 1/2004 |
| KR | 10-2004-0029165 A | 4/2004 |
| KR | 10-0665364 B1 | 12/2006 |

* cited by examiner

*Primary Examiner*—Jerome Jackson, Jr.
(74) *Attorney, Agent, or Firm*—McDermott Will & Emery LLP

(57) ABSTRACT

There is provided a nitride semiconductor light emitting device including: an n-type semiconductor region; an active layer formed on the n-type semiconductor region; a p-type semiconductor region formed on the active layer; an n-electrode disposed in contact with the n-type semiconductor region; a p-electrode formed on the p-type semiconductor region; and at least one intermediate layer formed in at least one of the n-type semiconductor region and the p-type semiconductor region, the intermediate layer disposed above the n-electrode, wherein the intermediate layer is formed of a multi-layer structure where at least three layers with different band gaps from one another are deposited, wherein the multi-layer structure includes one of an AlGaN layer/GaN layer/InGaN layer stack and an InGaN layer/GaN layer/AlGaN layer stack.

23 Claims, 11 Drawing Sheets

NITRIDE SEMICONDUCTOR LIGHT EMITTING DEVICE

CROSS-REFERENCE TO RELATED APPLICATIONS

This application claims the priority of Korean Patent Application No. 2007-0037129 filed on Apr. 16, 2007, in the Korean Intellectual Property Office, the disclosure of which is incorporated herein by reference.

BACKGROUND OF THE INVENTION

1. Field of the Invention

The present invention relates to a nitride semiconductor light emitting device, and more particularly, to a semiconductor light emitting device reduced in crystal defects and improved in brightness and electrostatic discharge resistance.

2. Description of the Related Art

Recently, a group III-V nitride semiconductor such as GaN layer, or simply a nitride semiconductor has been highlighted as a core material for a light emitting device such as a light emitting diode (LED) or a laser diode (LD) due to superior physical and chemical properties thereof. The group III-V nitride is typically formed of a semiconductor material having a composition expressed by $In_xAl_yGa_{1-x-y}N$, where $0 \leq x \leq 1$, $0 \leq y \leq 1$, and $0 \leq x+y \leq 1$. This nitride semiconductor light emitting device is applied as a light source for various products such as a keypad light emitting diode of a mobile phone, an electrical sign board, and a lighting device. Particularly, an advance in digital products utilizing the LED or LD has boosted a demand for a nitride semiconductor light emitting device with higher brightness and high reliability. For example, a side view LED used as a backlight of a mobile phone needs to be much brighter and thinner in line with a slimmer trend of the mobile phone.

However, typically, the nitride semiconductor such as GaN layer grown on a heterogeneous substrate such as a sapphire substrate entails many crystal defects due to lattice mismatch with the heterogeneous substrate. These defects seriously undermine reliability of the light emitting device, for example, resistance to electrostatic discharge (ESD). Besides, such defects absorb light to degrade brightness of the light emitting device. In one of many attempts to reduce crystal defects of the nitride semiconductor layer, selective epitaxial growth has been employed. However, the various attempts have entailed a complicated process such as deposition of a $SiO_2$ mask and high costs.

FIG. 1 is a cross-sectional view illustrating a conventional nitride semiconductor light emitting device, particularly, a nitride semiconductor LED. Referring to FIG. 1, the light emitting device 10 includes a sapphire substrate 11, and a buffer layer 13, an n-type GaN layer-based clad layer 14, an active layer 16, and a p-type GaN layer-based clad layer 18 sequentially deposited on the sapphire substrate 11. The n-type GaN layer-based clad layer 14 has a top surface partially exposed by mesa-etching and an n-electrode 24 is formed on the partially exposed top surface. A transparent electrode layer 20 made of e.g., ITO is formed on the p-type GaN layer-based clad layer 18 and a p-electrode 22 is formed on the transparent electrode layer 20. The buffer layer serves to relax lattice mismatch between the sapphire substrate and the n-type GaN layer-based clad layer 14. The buffer layer may be formed of a low-temperature AlN or a low-temperature GaN layer. Japanese Patent Laid-open Publication No. hei 10-135514 discloses an active layer formed of a multiple quantum well structure including an undoped GaN layer barrier layer and an undoped InGaN layer well layer to enhance light emitting efficiency.

However, the buffer layer 13, even when employed, does not sufficiently resolve crystal defects in the light emitting device 10. Still, considerable density defects remain in a nitride semiconductor crystal, notably in the active layer. These defects absorb light and hinder light emission in the active layer. Beside, such defects lower a reverse breakdown voltage (Vr) or a reverse electrostatic discharge (ESD) resistance voltage. These crystal defects accordingly deteriorate brightness and reliability of the light emitting device.

SUMMARY OF THE INVENTION

An aspect of the present invention provides a high-quality nitride semiconductor light emitting device having low crystal defect density in a nitride semiconductor crystal. An aspect of the present invention also provides a nitride semiconductor light emitting device ensuring high brightness and superior ESD resistance.

According to an aspect of the present invention, there is provided a nitride semiconductor light emitting device including: an n-type semiconductor region; an active layer formed on the n-type semiconductor region; a p-type semiconductor region formed on the active layer; an n-electrode disposed in contact with the n-type semiconductor region; a p-electrode formed on the p-type semiconductor region; and at least one intermediate layer formed in at least one of the n-type semiconductor region and the p-type semiconductor region, the intermediate layer disposed above the n-electrode, wherein the intermediate layer is formed of a multi-layer structure where at least three layers with different band gaps from one another are deposited, wherein the multi-layer structure includes one of an AlGaN layer/GaN layer/InGaN layer stack and an InGaN layer/GaN layer/AlGaN layer stack.

The intermediate layer may be formed of a multi-layer structure where one of the AlGaN layer/GaN layer/InGaN layer stack and the InGaN layer/GaN layer/AlGaN layer stack is deposited repeatedly. The intermediate layer may be formed of a superlattice structure where one of the AlGaN layer/GaN layer/InGaN layer stack and the InGaN layer/GaN layer/AlGaN layer stack is deposited repeatedly. Each of the layers of the intermediate layer may have a thickness of 10 to 300 Å.

The intermediate layer may be formed of a multi-layer structure where an AlGaN layer/GaN layer/InGaN layer/GaN layer stack forms one period and is deposited repeatedly.

The intermediate layer may be formed of a multi-layer structure modulation-doped for mobility modulation. In one of the AlGaN layer/GaN layer/InGaN layer stack and the InGaN layer/GaN layer/AlGaN layer stack, the AlGaN layer, the GaN layer, and InGaN layer are doped to a different concentration or with a different doping type from one another. For example, in the one of the AlGaN layer/GaN layer/InGaN layer stack and the InGaN layer/GaN layer/AlGaN layer stack, the AlGaN layer may be doped with a first conductivity, the GaN layer may be undoped and the InGaN layer may be doped with a second conductivity. Alternatively, in the one of the AlGaN layer/GaN layer/InGaN layer stack and the InGaN layer/GaN layer/AlGaN layer stack, the AlGaN layer is one of p-doped and undoped, the GaN layer may be n-doped and the InGaN layer may be undoped.

In the one of the AlGaN layer/GaN layer/InGaN layer stack and the InGaN layer/GaN layer/AlGaN layer stack, at least one of the AlGaN layer, GaN layer and InGaN layer may be modulation-doped. For example, in the one of the AlGaN layer/GaN layer/InGaN layer stack and the InGaN layer/GaN layer/AlGaN layer stack, at least one of the AlGaN layer, GaN layer and InGaN layer may be formed of a modulation-doped structure having one of a p-type layer/n-type layer/p-type layer stack and an n-type layer/p-type layer/n-type layer stack.

The intermediate layer may be at least partially In-doped. In added as a dopant, not a compositional element acts as a surfactant to pin dislocation defects.

The nitride semiconductor light emitting device may be a planar light emitting diode where the n-electrode and the p-electrode face an identical direction. The nitride semiconductor light emitting device may further include a substrate disposed below the n-type semiconductor region.

The nitride semiconductor light emitting device may be a vertical light emitting diode where the n-electrode and the p-electrode are formed on opposing sides. The nitride semiconductor light emitting device may further include a conductive substrate provided opposite to the active layer to interpose the n-type semiconductor region. The nitride semiconductor light emitting device may further include a conductive substrate provided opposite to the active layer to interpose the p-type semiconductor region.

The substrate may have a top surface defining a crystal plane for non-polar GaN layer growth. The substrate may formed of one of a-plane sapphire, r-plane sapphire, m-plane sapphire, SiC, LiAlO$_2$, ZnO and m-plane GaN. The conductive substrate may be formed of one of SiC, ZnO and m-plane GaN.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
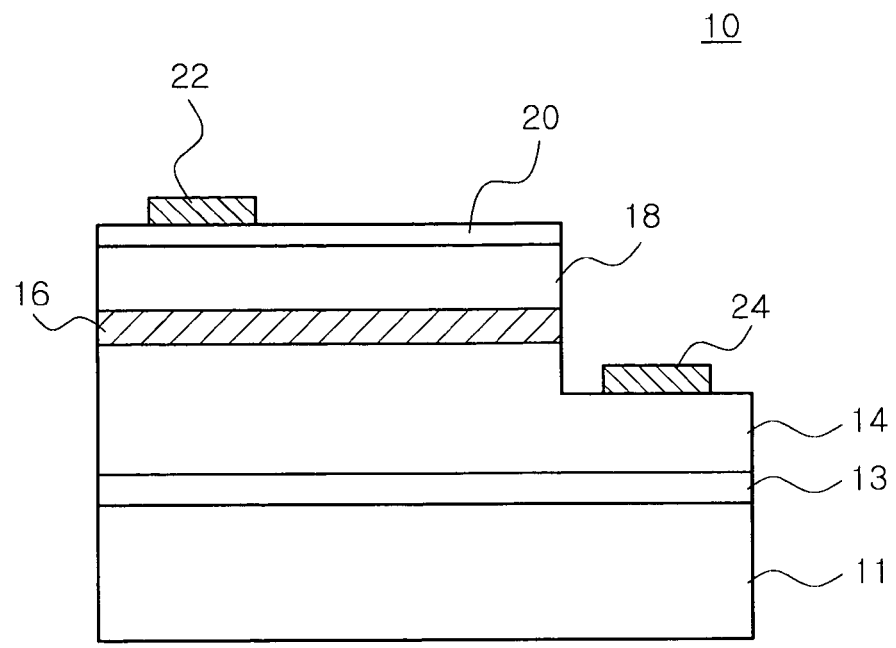
FIG. 1 is a cross-sectional view illustrating a conventional nitride semiconductor light emitting device.

Exemplary embodiments of the present invention will now be described in detail with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference signs are used to designate the same or similar components throughout.

Figure 2:
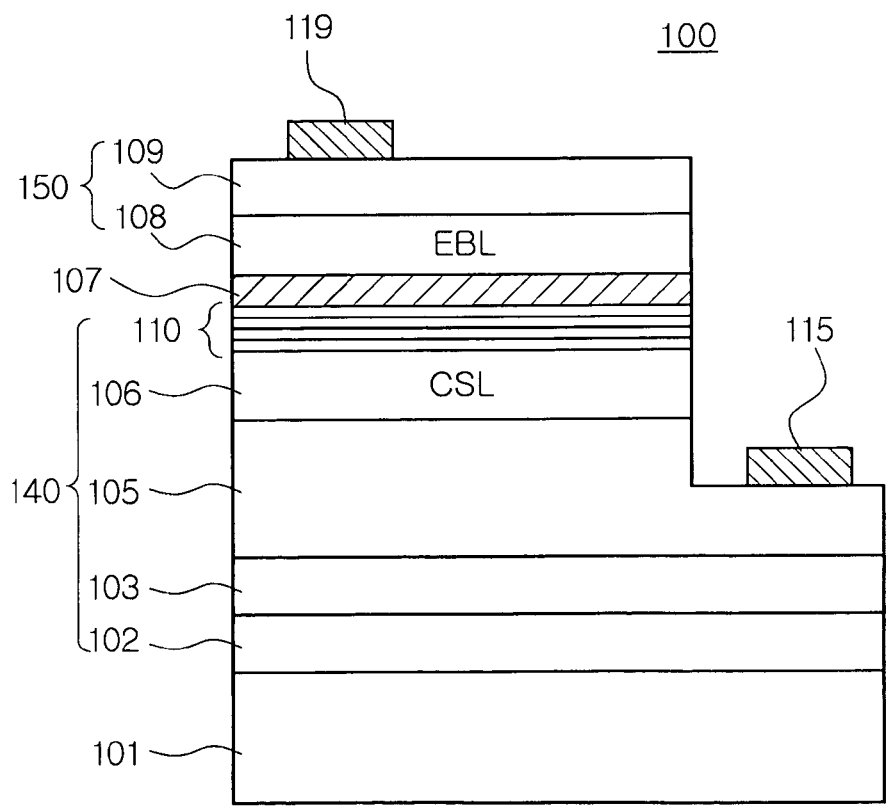
FIG. 2 is a cross-sectional view illustrating a nitride semiconductor light emitting device according to an exemplary embodiment of the invention.

FIG. 2 is a cross-sectional view illustrating a nitride semiconductor light emitting device according to an exemplary embodiment of the invention. Particularly, FIG. 2 illustrates a nitride semiconductor light emitting diode (LED). Referring to FIG. 2, the nitride semiconductor light emitting device 100 includes a sapphire substrate, and an undoped GaN layer 102, a first n-type nitride semiconductor layer 103, a second n-type nitride semiconductor layer 105, a current spreading layer (CSL) 106, an intermediate layer 110 of a multi-layer structure, an active layer 107, an electron blocking layer (EBL) 108 and a p-type contact layer 109.

The first n-type nitride semiconductor layer 103 is formed of, for example, an n-doped GaN layer and the second n-type nitride semiconductor layer 105 is an n-type contact layer which is formed of, for example, a high-concentration n+ doped GaN layer. The current spreading layer 106 facilitates current spreading in a lateral direction, and may include an InGaN layer with relative thickness. The electron blocking layer 108 may be formed of a p-type AlGaN layer having a relatively big band gap. The p-type contact layer 109 may be formed of e.g., a p-doped GaN layer and/or a p-doped AlGaN layer. The active layer 107 may be formed of an InGaN layer/GaN layer multiple quantum well or single quantum well structure.

A p-electrode 119 is formed on the p-type nitride semiconductor layer 109 and the second n-type nitride semiconductor layer 105 is mesa-etched to partially expose a top surface thereof, and an n-electrode 115 is formed on the partially exposed top surface. Although not illustrated, a buffer layer such as a low-temperature AlN layer may be formed between the sapphire substrate 101 and the undoped GaN layer 102. As described above, the n-electrode 115 and the p-electrode 119 are formed to face an identical direction, thereby allowing the light emitting device 100 to constitute a planar light emitting diode.

The light emitting device 100 has a semiconductor region largely defined into three regions based on location of the active layer, that is, an n-type semiconductor region 140, a p-type semiconductor region 150 and the active layer 107 disposed therebetween. The undoped GaN layer 102, the first and second n-type nitride semiconductor layers 103 and 105, the current spreading layer 106 and the intermediate layer 107 represent the n-type semiconductor region 140 of the light emitting device 100. Moreover, the electron blocking layer 108 and the p-type contact layer 109 correspond to the p-type semiconductor region 150. In the present embodiment, the intermediate layer 110 of a multi-layer structure is disposed in the n-type semiconductor region 140, particularly, adjacently below the active layer.

The intermediate layer 110 is located above the n-electrode 115 and formed of a multi-layer structure where at least three layers with different band gaps from one another are deposited. Particularly, the intermediate layer 110 includes an AlGaN layer/GaN layer/InGaN layer stack or an InGaN layer/GaN layer/AlGaN layer stack. Here, AlGaN layer is represented by $Al_xGa_{1-x}N(0<x<1)$ with Al composition and InGaN layer is represented by $In_yGa_{1-y}N(0<y<1)$ with In composition. As described above, the intermediate layer 110 includes the AlGaN layer/GaN layer/InGaN layer stack or InGaN layer/GaN layer/AlGaN layer stack which is a band gap modulated multi-layer structure, thereby effectively relaxing stress in crystals and blocking crystal defects.

In more detailed description, a GaN layer is inserted between AlGaN layer with the largest band gap and InGaN layer with the smallest band gap, out of the AlGaN layer, InGaN layer, and GaN layer. This allows the GaN layer to effectively relieve stress resulting from lattice mismatch between the AlGaN layer and InGaN layers, particularly, tensile strength in the AlGaN layer and compressive stress in the InGaN layer. Accordingly, the intermediate layer 110 effectively blocks crystal defects and a nitride semiconductor grown on the intermediate layer 110 is improved in crystallinity. Also, the intermediate layer 110 including the AlGaN layer/GaN layer/InGaN layer stack or InGaN layer/GaN layer/AlGaN layer stack assures bending and pinning effects of dislocation defects. The intermediate layer 110 with such a band gap-modulated structure improves crystallinity to thereby enhance ESD resistance of the light emitting device.

The intermediate layer 110 may feature a multi-layer structure where the AlGaN layer/GaN layer/InGaN layer stack or InGaN layer/GaN layer/AlGaN layer stack is deposited repeatedly in order to further serve to relieve stress and increase bending and pinning effect of crystal defects. Particularly, the intermediate layer 110 may be formed of a supperlattice structure where the AlGaN layer/GaN layer/InGaN layer stack or InGaN layer/GaN layer/AlGaN layer stack is repeatedly deposited. This allows the intermediate layer 110 to more effectively bend and pin the dislocation defects and thus block the dislocation defects more thoroughly. To form this superlattice structure, each of the layers constituting the intermediate layer 110 may have a thickness of 10 to 300 Å.

In the present embodiment, the intermediate layer 110 of a multi-layer structure is disposed just below the active layer 107 to thereby effectively suppress or bend crystal defects caused by stress in a thick InGaN layer of the current spreading layer 106. As described above, the multi-layer structure with at least three layers whose band gaps are modulated can be repeatedly deposited to allow current to spread laterally. Notably, the intermediate layer 110, when inserted just below the active layer 107, ensures more excellent current spreading effect together with the current spreading layer 106. This current spreading effect leads to less current concentration, thereby improving ESD resistance. However, the intermediate layer 110 should not be necessarily disposed underneath the active layer. For example, the intermediate layer 110 may be inserted in the p-type semiconductor region 150 (see FIG. 3).

The intermediate layer 110 may be at least partially doped with an n-dopant such as Si or a p-type dopant such as Mg. Alternatively, the intermediate layer 110 may be an undoped layer. Particularly, the intermediate layer 110 may feature a modulation doped multi-layer structure for mobility modulation. Mobility modulation attained by modulation doping of the intermediate layer 110 of a multi-layer structure maximizes current spreading and further increases ESD resistance. Specifically, the AlGaN layer/GaN layer/InGaN layer stack or InGaN layer/GaN layer/AlGaN layer stack may be doped such that constituent layers, i.e., AlGaN layer, GaN layer, and InGaN layer have a different doping concentration or different doping type from one another. The modulation doping may have a doping profile in an abrupt, step-like shape or an inclined shape.

As an exemplary modulation doping for mobility modulation, in the AlGaN layer/GaN layer/InGaN layer stack or InGaN layer/GaN layer/AlGaN layer stack of the intermediate layer 110, the AlGaN layer may be doped with a first conductivity type, i.e., one of n-type and p-type, the GaN layer may be undoped and the InGaN layer may be doped with a second conductivity type, i.e., the other one of n-type and p-type. By this modulation doping, the n-type layer, the undoped layer and the p-type layer with much lower mobility are formed in the stack. This maximizes current spreading through mobility modulation and accordingly enhances ESD resistance of the light emitting device significantly. Moreover, the GaN layer provided as an undoped layer between the AlGaN layer and the InGaN layer serves as a buffer between the n-type layer and the p-type layer, while mitigating stress resulting from different modulation of the band gaps.

An another exemplary of modulation doping for mobility modulation, the intermediate layer 110 with a structure where the AlGaN layer/GaN layer/InGaN layer stack or InGaN layer/GaN layer/AlGaN layer stack is repeatedly deposited may be modulation doped such that the AlGaN layer is doped with a p-type or undoped, the GaN layer is doped with an n-type and the InGaN layer is undoped. By this modulation doping, the InGaN layer with the lowest band gap exhibits superb carrier mobility, the AlGaN layer is increased in band gap to allow electrons or holes to be less mobile at a portion adjacent to the InGaN layer. This accordingly ensures more effective current spreading in the InGaN layer. Such a current spreading effect results in better ESD of the light emitting device.

In addition, the intermediate layer 110 including the AlGaN layer/GaN layer/InGaN layer stack or InGaN layer/GaN layer/AlGaN layer stack may be modulation-doped such that at least one of the AlGaN layer, GaN layer and InGaN layer, for example, the AlGaN layer may be doped inside to a different concentration or with a different doping type. For example, the AlGaN layer may be modulation doped into a p-type layer/n-type layer/p-type layer or into an n-type layer/p-type layer/n-type layer (see FIG. 15). This modulation doping in the layer of each band gap also leads to better current spreading in a lateral direction.

The intermediate layer 110 may be at least partially In-doped. In added as a dopant is not present as a compositional element unlike In in a pure InGaN layer material. In added as a dopant, not as a compositional element, serves as a surfactant in the nitride semiconductor layer. Accordingly, the In dopant reduces an activation energy of the n-type dopant such as Si or the p-type dopant such as Mg, thereby increasing a ratio of Si or Mg dopant for generating carriers. Also, In added as a dopant pins dislocation defects. Therefore, In added as a dopant to the intermediate layer 110 further decreases dislocation defect density of the layer(s) grown on the intermediate layer 110.

In the present embodiment, a sapphire ($Al_2O_3$) substrate is adopted as a substrate 101 for growing a nitride semiconductor crystal. However, the sapphire substrate may be substituted by a SiC substrate, a Si substrate, a ZnO substrate, an MgO substrate, and a GaN layer substrate which can be utilized for growing the nitride semiconductor layer. Particularly, the substrate 101 may have a crystal plane for non-polar GaN layer growth. For example, the substrate 101 may employ one of a-plane sapphire, an r-plane sapphire, an m-plane sapphire, a SiC substrate, a $LiAlO_2$ substrate, a ZnO substrate and an m-plane GaN substrate. The nitride semiconductor crystal grown based on the crystal plane for growing the non-polar GaN layer growth serves to mitigate polarization-induced stress, thereby enhancing optical efficiency of the light emitting device.

In the present embodiment, the light emitting device 100 includes only one intermediate layer 110 but may include at least two intermediate layers in the n-type region 140, For example, apart from the intermediate layer 110 formed between the active layer 107 and the current spreading layer 106, an additional intermediate layer may be inserted between the current spreading layer 106 and the second n-type nitride semiconductor layer 105 and/or below the second n-type nitride semiconductor layer 105.

Figure 3:
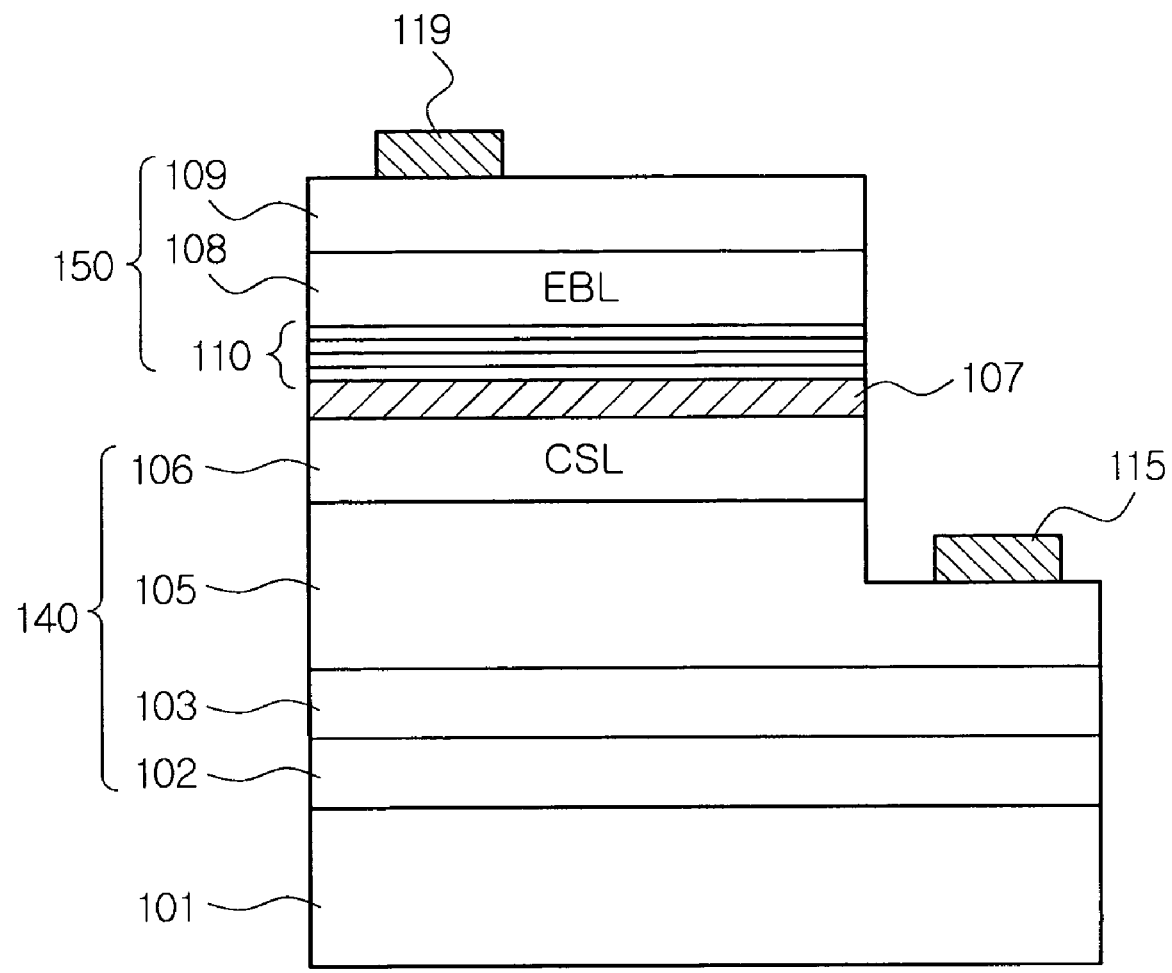
FIG. 3 is a cross-sectional view illustrating a nitride semiconductor light emitting device according to an exemplary embodiment of the invention.

FIG. 3 is a cross-sectional view illustrating a nitride semiconductor light emitting device according to an exemplary embodiment of the invention. As described above, in the light emitting device 200 of FIG. 3, an intermediate layer 110 of a band gap-modulated multi-layer structure is disposed in a p-type semiconductor region 150. Particularly, the intermediate layer 110 is disposed above an active layer 107, and below an electron blocking layer 108 and a p-type contact layer 109. In the present embodiment of FIG. 3, the intermediate layer 110 includes an AlGaN layer/GaN layer/InGaN layer stack or InGaN layer/GaN layer/AlGaN layer stack, or features a structure where the AlGaN layer/GaN layer/InGaN layer stack or InGaN layer/GaN layer/AlGaN layer stack is repeatedly deposited and a superlattice structure where the AlGaN layer/GaN layer/InGaN layer stack or InGaN layer/GaN layer/AlGaN layer stack is repeatedly deposited. This assures less dislocation defects and better ESD resistance. In the present embodiment, as described above, the intermediate layer 110 can be modulation doped for mobility modulation or modulation doped in a corresponding one of constituent layers. Of course, the intermediate layer 110 can be In-doped.

Particularly, in the present embodiment of FIG. 3, the intermediate layer 110 is disposed above the active layer 107 to prevent crystal defect caused by stress from the active layer 107. This ensures superior quality of the overlying electron blocking layer 108 and p-type contact layer 109. This accordingly reduces leakage current and increases ESD resistance. In the present embodiment of FIG. 3, the intermediate layer 110 is disposed below the electron blocking layer 108 but alternatively may be formed above the electron blocking layer 108 and below the p-type contact layer 109. The at least two intermediate layers may be formed in the p-type region.

Figure 4:
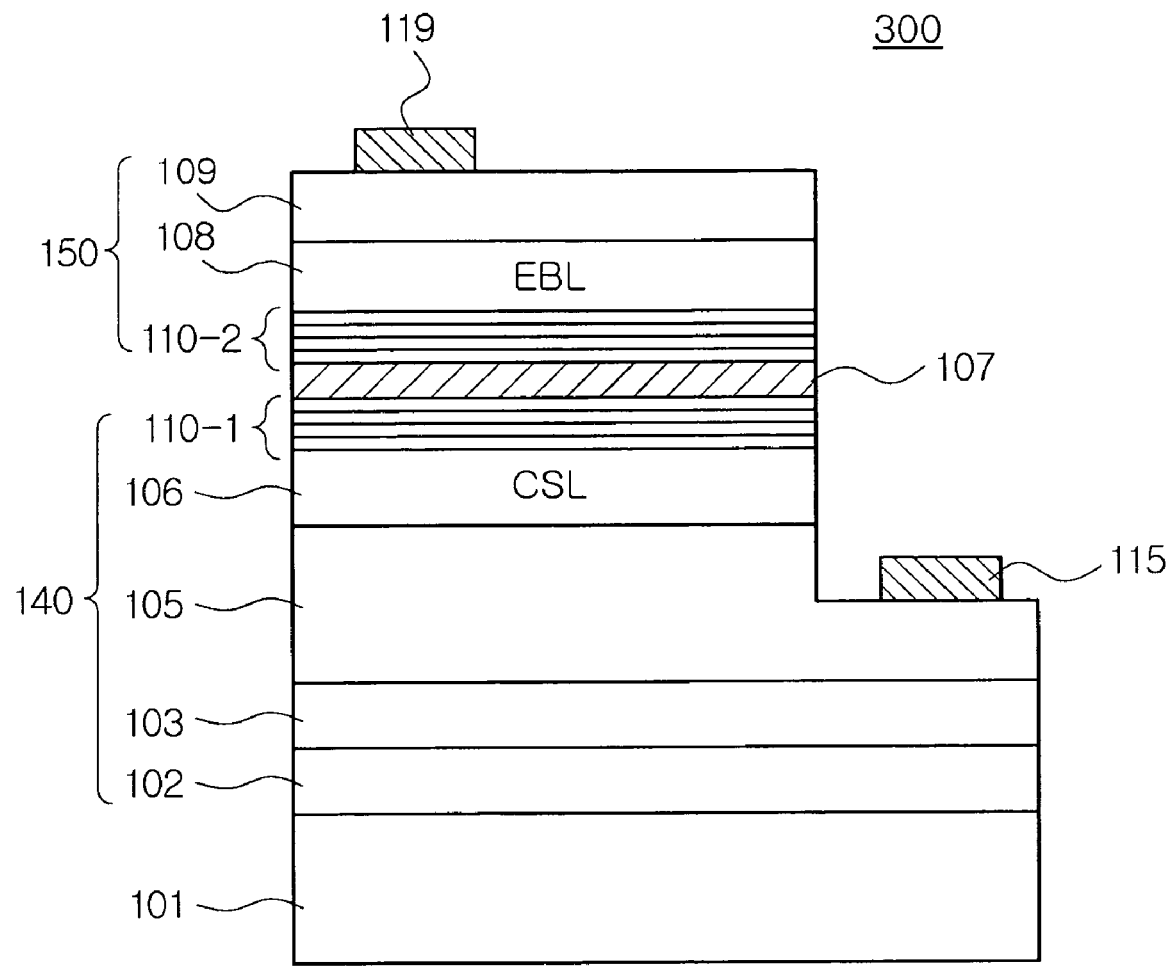
FIG. 4 is a cross-sectional view illustrating a nitride semiconductor light emitting device according to an exemplary-embodiment of the invention.

FIG. 4 is a cross-sectional view illustrating a nitride semiconductor light emitting device 300 according to an exemplary embodiment of the invention. In the present embodiment of FIG. 4, intermediate layers 110-1 and 110-2 of a multi-layer structure are disposed in an n-type region 140 and a p-type region 150 as well. That is, a first intermediate layer 110-1 is inserted between a current spreading layer 106 and an active layer in the n-type semiconductor region 140, and a second intermediate layer 110-2 is inserted between an electron blocking layer 108 and an active layer 107 in the p-type semiconductor region 150. The first and second intermediate layers 110-1, and 110-2 may be band gap modulated, modulation doped and In-doped in the same manner as the intermediate layer 110 described above.

As described above, the intermediate layers can be inserted in the n-type region 140 below the active layer 107 and in the p-type region 150 above the active layer 107. This improves crystallinity of the semiconductor layers 108 and 109 above the active layer 107 and also effectively assures crystalline quality of the active layer 107. An additional intermediate layer may be inserted between the p-type contact layer 109 and the electron blocking layer 108, between the current spreading layer 106 and the second n-type nitride semiconductor layer 105 or below the second n-type nitride semiconductor layer 105.

FIGS. 5 to 8 are cross-sectional views illustrating a nitride semiconductor light emitting device according to an exemplary embodiment of the invention. In the present embodiments of FIGS. 5 to 8, an n-electrode and a p-electrode are arranged on opposing sides of a light emitting structure including an n-type region, an active layer and a p-type region, thereby constituting a vertical or vertical geometry light emitting diode.

Figure 5:
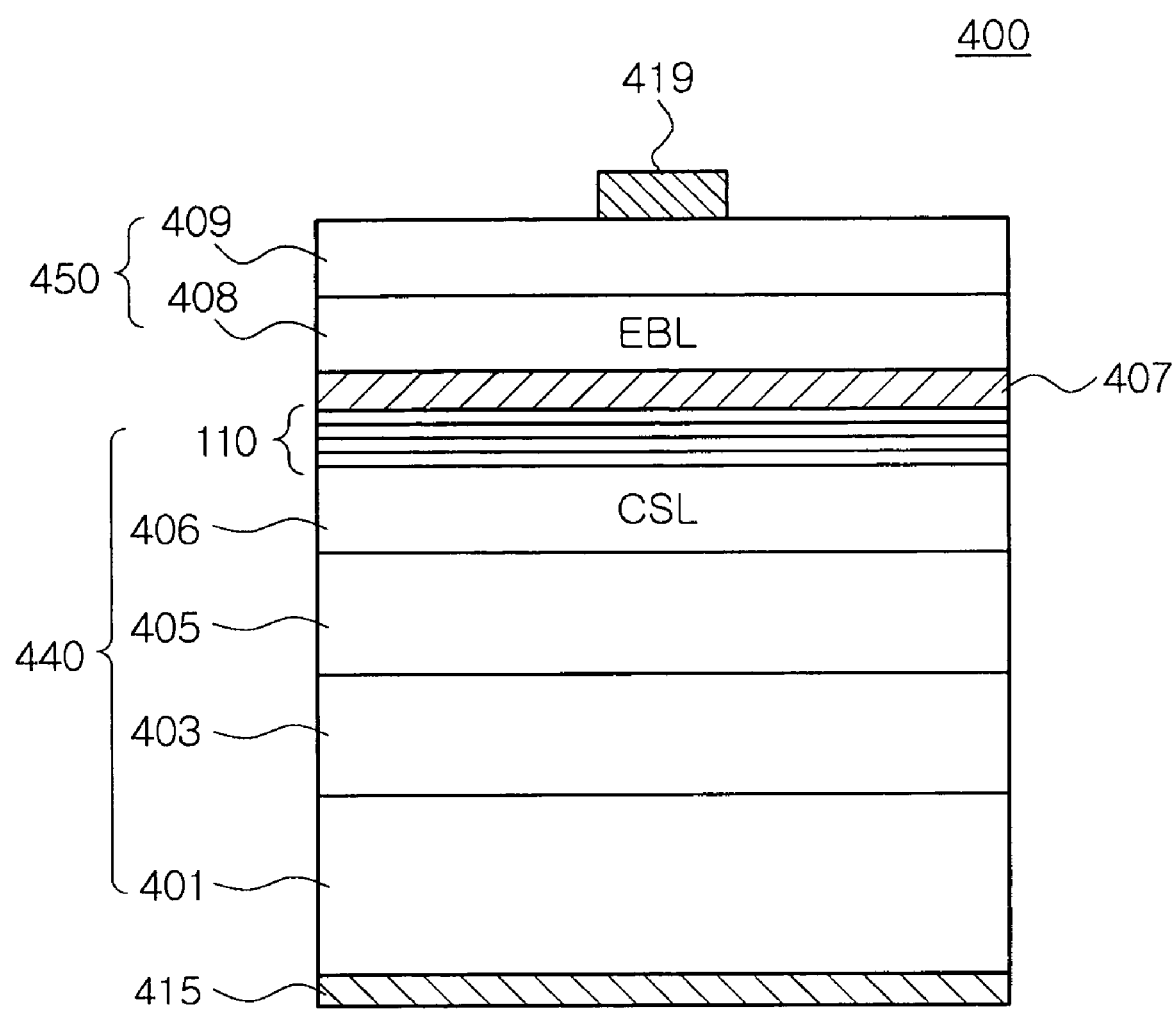
FIG. 5 is a cross-sectional view illustrating a nitride semiconductor light emitting device according to an exemplary embodiment of the invention.

Referring to FIG. 5, a light emitting device 400 includes a conductive substrate 401 made of e.g., SiC, and a first n-type nitride semiconductor layer 403, a second n-type nitride semiconductor layer 405, a current spreading layer 406, an intermediate layer 110 of a multi-layer structure, an active layer 407, an electron blocking layer (EBL) 408, and a p-type contact layer 409. The n-type nitride semiconductor layers 403 and 405, the current spreading layer and the intermediate layer 110 correspond to an n-type semiconductor region 440 and the electron blocking layer 408 and the p-type contact layer 409 correspond to a p-type semiconductor region 450. A p-electrode 419 is disposed on the p-type contact layer 409 and an n-electrode 415 is disposed on a bottom of the conductive substrate 401. As described above, the intermediate layer 110 of a multi-layer structure is applicable to a vertical LED.

In the present embodiment, as described above, the intermediate layer 110 includes a band gap modulated AlGaN layer/GaN layer/InGaN layer stack or InGaN layer/GaN layer/AlGaN layer stack, or is formed of a structure where the AlGaN layer/GaN layer/InGaN layer stack or InGaN layer/GaN layer/AlGaN layer stack is repeatedly deposited or a superlattice structure where the AlGaN layer/GaN layer/InGaN layer stack or InGaN layer/GaN layer/AlGaN layer stack is repeatedly deposited. This enhances crystalline quality and increases ESD resistance. Also, the AlGaN layer/GaN layer/InGaN layer stack or InGaN layer/GaN layer/AlGaN layer stack is modulation doped or In-doped. Alternatively, in the AlGaN layer/GaN layer/InGaN layer stack or InGaN layer/GaN layer/AlGaN layer stack of the intermediate layer 110, at least one of constituent layers may be modulation doped for mobility modulation or In-doped. The intermediate layer 110 may be formed in at least two portions of the n-type region 440.

The conductive substrate 401 may adopt a substrate having a crystal plane for non-polar GaN layer growth to relieve polarization-induced stress. For example, the conductive substrate 401 may adopt one of a SiC substrate, a ZnO substrate and an m-plane GaN substrate. Also, an LED of a thin film structure may be utilized without the conductive substrate

401 provided. Here, the n-electrode 415 can be brought in direct contact with the n-type semiconductor layer 403 without the conductive substrate provided.

Figure 6:
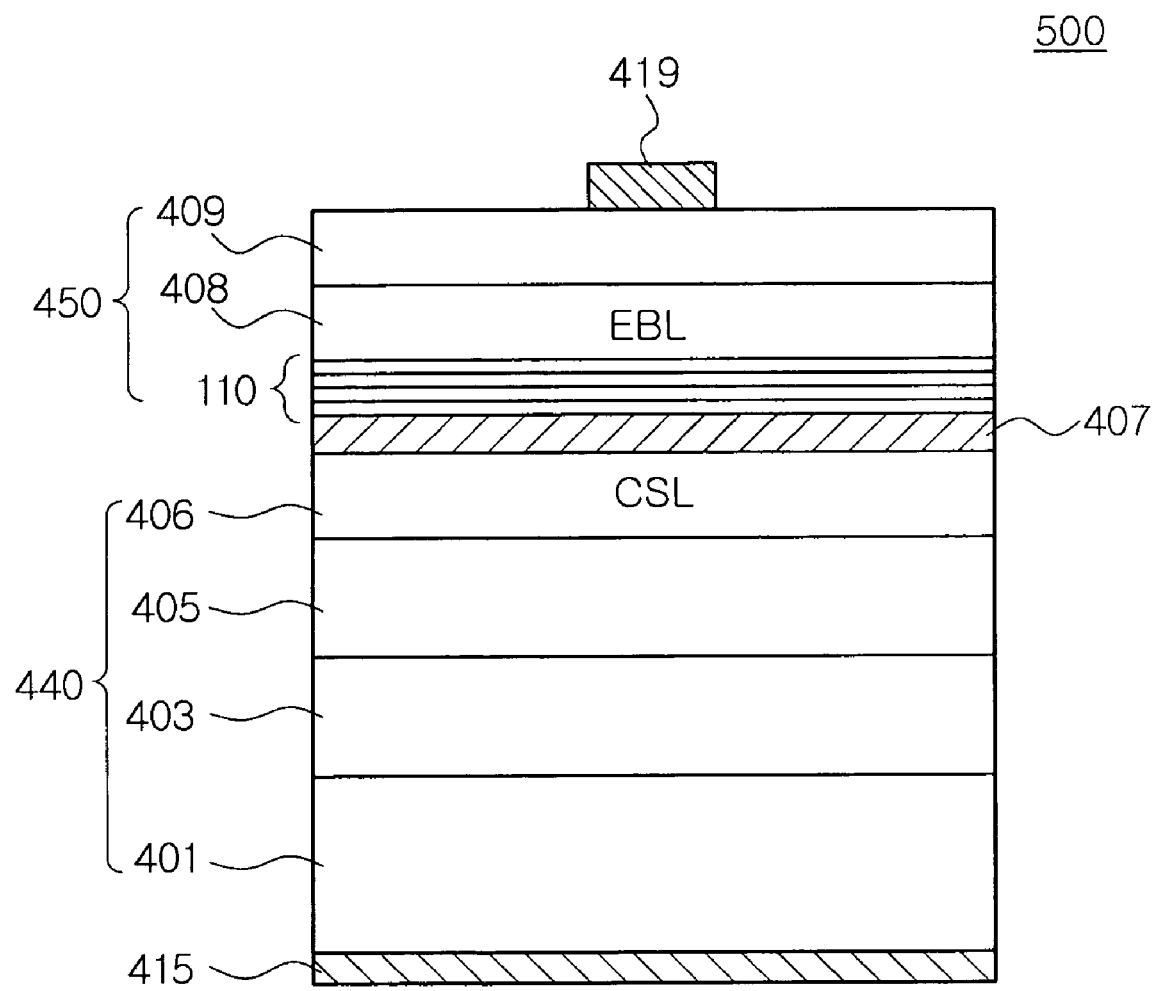
FIG. 6 is a cross-sectional view illustrating a nitride semiconductor light emitting device according to an exemplary embodiment of the invention.

FIG. 6 is across-sectional view illustrating a vertical light emitting device 500 according to an exemplary embodiment of the invention. Referring to FIG. 6, an intermediate layer 110 is disposed in a p-type semiconductor region 450. Other elements and characteristics, band gap modulation of the intermediate layer 110 or modulation doping are the same as described above. The intermediate layer 110 may be disposed in at least two portions of the p-type region.

Figure 7:
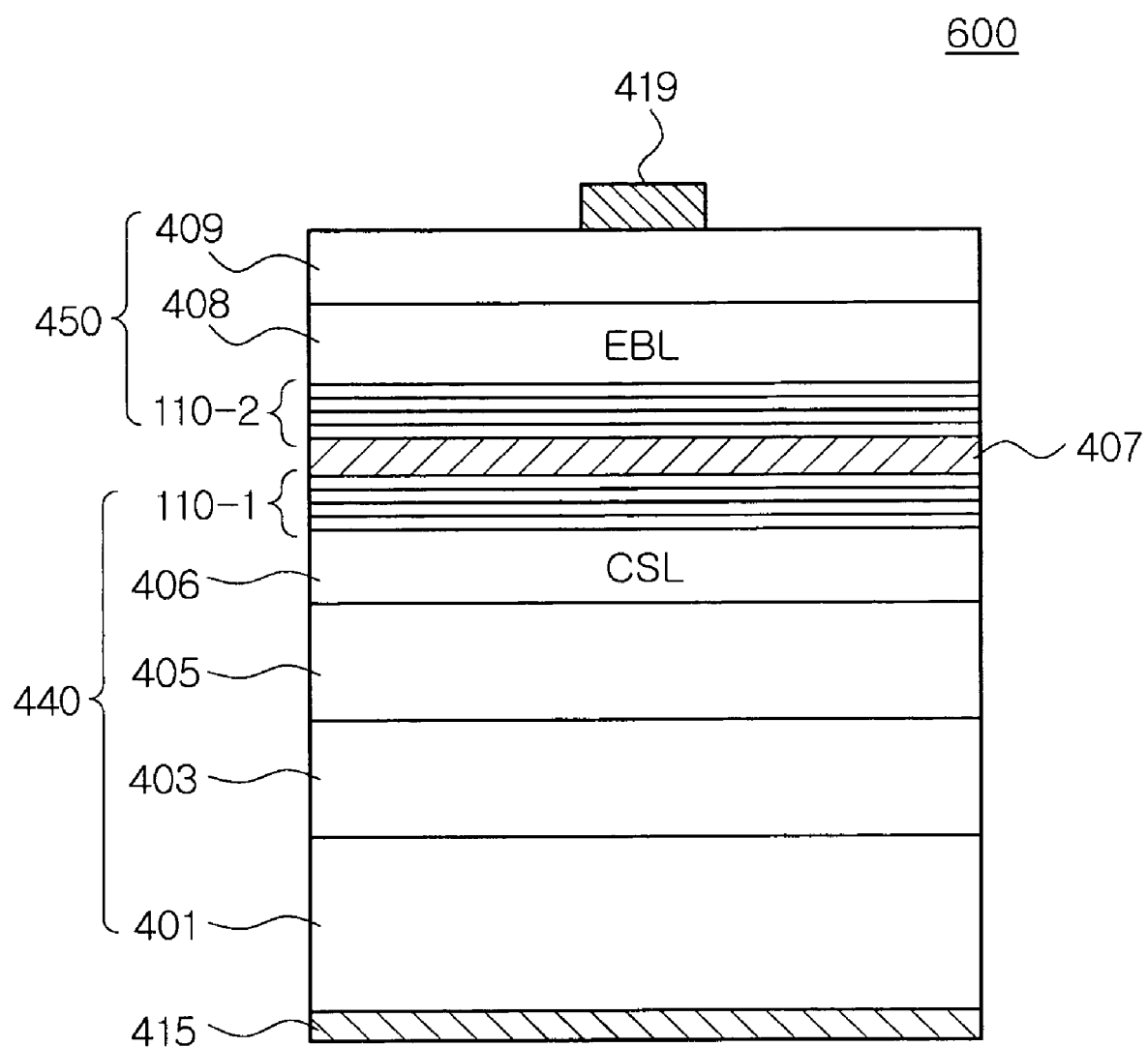
FIG. 7 is a cross-sectional view illustrating a nitride semiconductor light emitting device according to an exemplary embodiment of the invention.

FIG. 7 is across-sectional view illustrating a vertical light emitting device 600 according to an exemplary embodiment of the invention. The light emitting device 600 has intermediate layers 110-1, and 110-2 formed in both an n-type region 440 and a p-type region 450. Apart from the intermediate layers 110-1, and 110-2 shown in FIG. 7, an additional intermediate layer may be inserted between an electron blocking layer 408 and a p-type contact layer 409 or below a current spreading layer 406.

Figure 8:
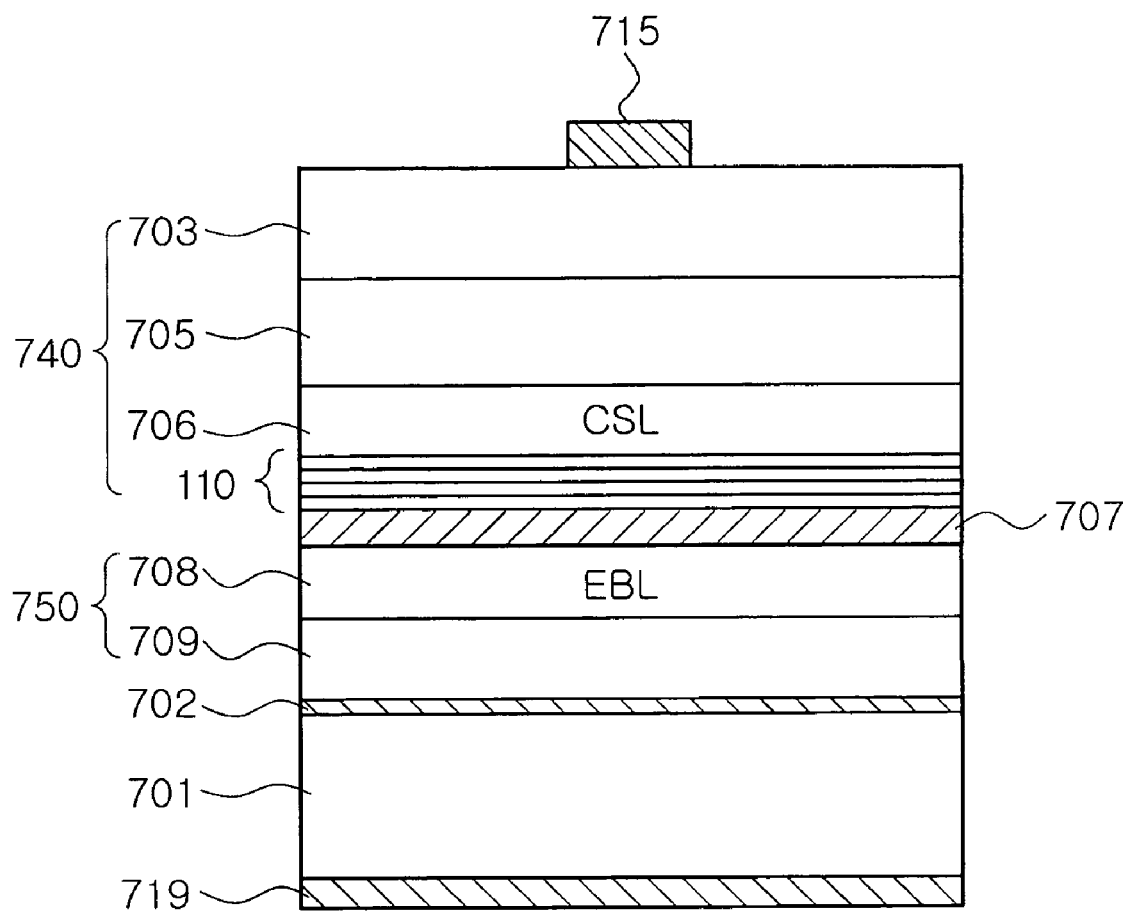
FIG. 8 is a cross-sectional view illustrating a nitride semiconductor light emitting device according to an exemplary embodiment of the invention.

FIG. 8 is across-sectional view illustrating a vertical light emitting device 700 according to an exemplary embodiment of the invention. Referring to FIG. 8, unlike the aforesaid embodiments, the light emitting device 700 includes a conductive substrate 701, and a p-type region 750, an active layer 707 and an n-type region 740 sequentially deposited on the conductive substrate 701. That is, the conductive substrate 701 has a conductive adhesive layer 702, a p-type contact layer 709, an electron blocking layer 708, an active layer 707, an intermediate layer 110 of a multi-layer structure, a current spreading layer 706, a second n-type nitride semiconductor layer 705 and a first n-type nitride semiconductor layer 703 deposited sequentially thereon. A p-electrode 719 is formed on a bottom of the conductive substrate 701 and an n-electrode 715 is formed on the first n-type nitride semiconductor layer 703.

This vertical light emitting device 700 can be obtained by bonding the conductive substrate and removing the growth substrate. For example, the first and second n-type nitride semiconductor layers 703 and 705, the current spreading layer 706, the intermediate layer 110, the active layer 707, the electron blocking layer 708, and the p-type contact layer 709 are sequentially grown on the sapphire substrate (not shown). Then, the conductive substrate 701 is bonded to the p-type contact layer 709 using a conductive bonding layer 702 formed of e.g., Au. Thereafter, the sapphire substrate is removed by e.g., laser lift-off, and the n-electrode 715 can be formed on a surface of the first n-type nitride semiconductor layer 703 from which the sapphire substrate is removed. The conductive substrate 401 may adopt a conductive substrate made of e.g., SiC, ZnO, and GaN layer or a metal substrate made of e.g., Al and Cu.

Referring to FIG. 8, when the light emitting device 700 is turned upside down so that the n-type region 740 faces downward, i.e., the n-type region/active layer/p-type region are deposited sequentially from a bottom, the intermediate layer 110 is disposed above the n-electrode 715 in the same manner as described above. In the present embodiment, the intermediate layer 110 is disposed in the n-type region 740 and may be formed in the p-type region 750. Also, the intermediate layer 110 may be inserted in both the n-type region 740 and the p-type region 750.

Hereinafter, a description will be given of a structure of the intermediate layer 110 and a band gap structure thereof according to various embodiment of the invention with reference to FIGS. 9 to 15.

First Embodiment

Figure 9:
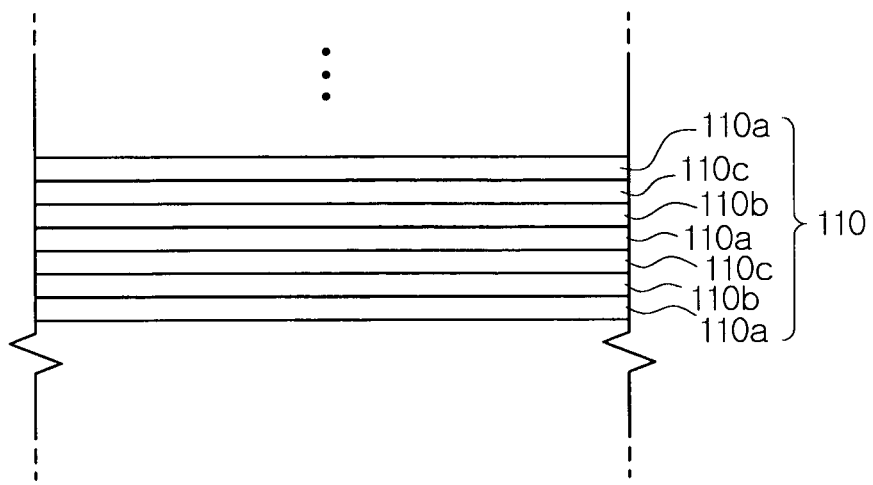
FIG. 9 is a partial cross-sectional view illustrating an intermediate layer of a multi-layer structure according to a first embodiment of the invention.
Figure 10:
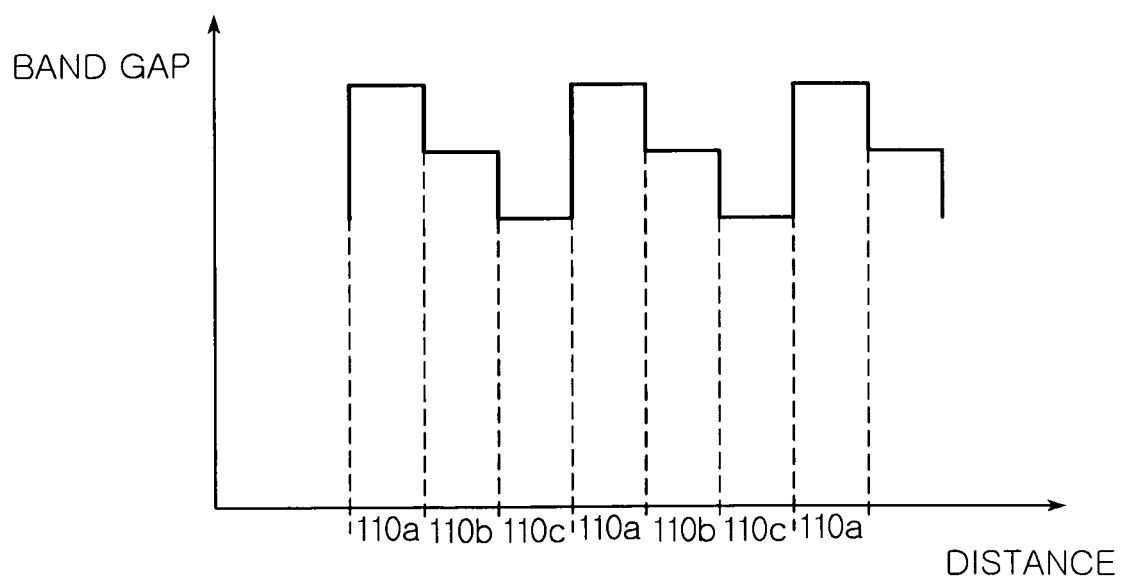
FIG. 10 is a graph illustrating an exemplary band gap profile of the intermediate layer of a multi-layer structure of FIG. 9.

FIG. 9 is a partial cross-sectional view illustrating an intermediate layer of a multi-layer structure according to a first embodiment of the invention and FIG. 10 is a graph illustrating an exemplary band gap profile of the intermediate layer of a multi-layer structure shown in FIG. 9. In FIG. 9, a substrate is disposed at a bottom.

Referring to FIGS. 9 and 10, the intermediate layer 110 of a multi-layer structure includes a stack having an AlGaN layer 110*a*, a GaN layer 110*b* and an InGaN layer 110*c* deposited sequentially. Particularly, the AlGaN layer 110*a*/GaN layer 110*b*/InGaN layer 110*c* stack is repeatedly deposited. In the present embodiment, the AlGaN layer 110*a*/GaN layer 110*b*/InGaN layer 110*c* form one period of the multi-layer structure. The intermediate layer 110 may feature a superlattice structure. Out of nitride semiconductor layers 110*a*, 110*b*, and 110*c* of the intermediate layer 110, the AlGaN layer 110*a* has the largest band gap and the InGaN layer 110*c* has the smallest band gap. The GaN layer 110*b* inserted between the AlGaN layer 110*a* and the InGaN layer 110*c* has a band gap smaller than that of the AlGaN layer 110*a* and larger than that of the InGaN layer 110*c*.

Such a multilayer structure including AlGaN layer/GaN layer/InGaN layer with different band gaps from one another as described above effectively blocks dislocation defects. Notably, the InGaN layer 110*c* effectively bends and stops dislocation defects when the AlGaN layer 110*a* and the GaN layer 110*b* are grown. Also, the GaN layer 110*b* serves to relax tensile stress generated from the AlGaN layer 110*a* with a large band gap and compressive force generated from the InGaN layer 110*c* with a small band gap. Therefore, the intermediate layer 110 is capable of blocking dislocation defects while relieving compressive stress.

To further ensure dislocation defects to be blocked, the intermediate layer may be at least partially doped with In as a dopant, not as a compositional element. That is, at least one of constituent layers of the intermediate layer, e.g., the AlGaN layer 110*a* may by In-doped. In added as a dopant in the intermediate layer 110 acts as a surfactant to bend dislocation defects, thereby allowing the nitride semiconductor layer with much less dislocation defects to be grown on the intermediate layer 110. The active layer 107, 407, and 707, when formed on the intermediate layer, is decreased in non-radiative recombination due to less dislocation defects as described above. Instead, the active layer is increased in radiative recombination, thereby enhancing brightness of the light emitting device. Moreover, this results in higher crystal quality of the semiconductor layers providing a current path, accordingly reducing operating voltage and increasing ESD resistance of the light emitting device. Particularly, the AlGaN layer/GaN layer/InGaN layer stack, when repeatedly deposited, leads to band gap modulation and thus allows current to spread laterally. This as a result increases ESD resistance.

Also, the AlGaN layer/GaN layer/InGaN layer stack, when modulation doped for mobility modulation, ensures current to spread further in a layer with relatively higher mobility. For example, the intermediate layer 110 including an n-AlGaN layer/u-GaN layer/p-InGaN layer stack has an undoped GaN layer(u-GaN layer) located in the middle to ensure mobility modulation, thereby further increasing current spreading effect. Also, the intermediate layer 110 may be formed of a structure where a (p-AlGaN layer/u-AlGaN layer)/n-GaN layer/u-InGaN layer stack is repeatedly deposited. Accordingly, the u-InGaN layer with the lowest band gap has good mobility, the p-AlGaN layer is increased in band gap to reduce mobility. This allows current to spread more effectively in the u-InGaN layer. With further improvement in current spreading characteristics, ESD resistance can be additionally increased. The modulation doping may have a profile in an abrupt, step-like shape and an inclined shape as well.

Second Embodiment

Figure 11:
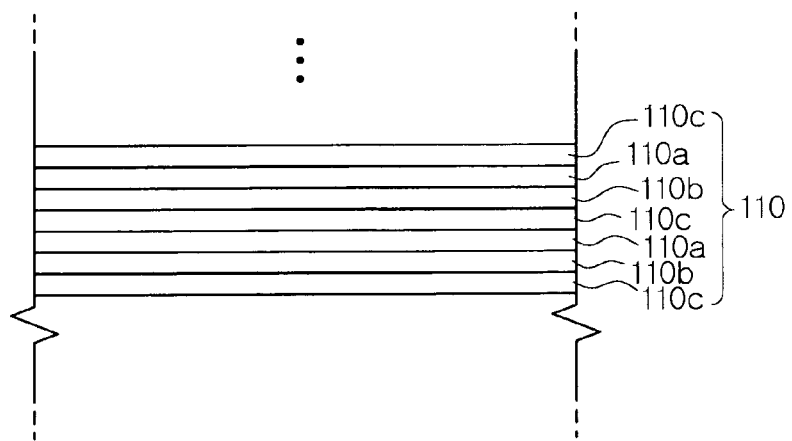
FIG. 11 is a partial cross-sectional view illustrating an intermediate layer of a multi-layer structure according to a second embodiment of the invention.
Figure 12:
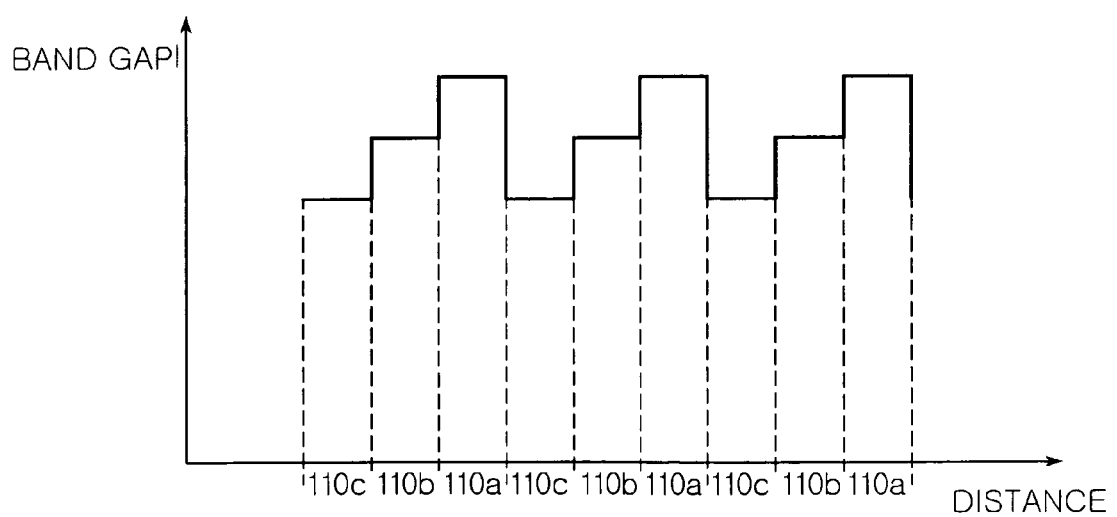
FIG. 12 is a graph illustrating an exemplary band gap profile of the intermediate layer of a multi-layer structure of FIG. 11.

FIG. 11 is a partial cross-sectional view illustrating an intermediate layer of a multi-layer structure according to a second embodiment of the invention. FIG. 12 is a graph illustrating an exemplary band gap profile of the intermediate layer of a multi-layer structure of FIG. 11. The intermediate layer of the second embodiment is different from the intermediate layer of the first embodiment in terms of sequence of layers deposited.

Referring to FIGS. 11 and 12, the intermediate layer is formed of a structure where an InGaN layer 110c/GaN layer 110b/AlGaN layer 110a stack is sequentially deposited. Here, the layers of the intermediate layer are deposited in a different sequence from those of the first embodiment of FIG. 5. In the present embodiment, the InGaN layer 110c/GaN layer 110b/AlGaN layer 110a form one period of the multi-layer structure. The intermediate layer 110 may be formed of a superlattice structure.

In the same manner as the first embodiment, the multilayer structure of InGaN layer/GaN layer/AlGaN layer with band gaps different from one another effectively blocks dislocation defects, thereby reducing crystal defect density of the semiconductor layer(s) formed above the intermediate layer 110, and increasing brightness and ESD resistance.

Third Embodiment

Figure 13:
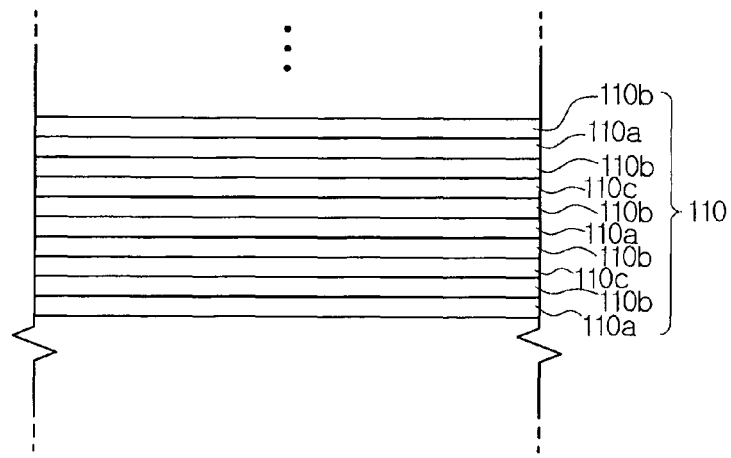
FIG. 13 is a partial cross-sectional view illustrating an intermediate layer of a multi-layer structure according to a third embodiment of the invention.
Figure 14:
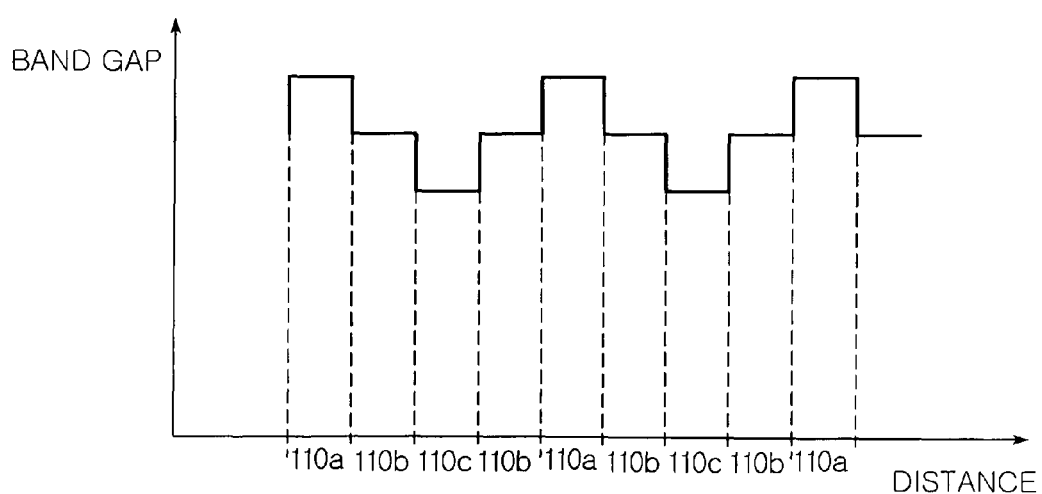
FIG. 14 is a graph illustrating an exemplary band gap profile illustrating the intermediate layer of a multi-layer structure of FIG. 13.

FIG. 13 is a partial cross-sectional view illustrating an intermediate layer of a multi-layer structure according to a third embodiment of the invention. FIG. 14 is a graph illustrating an exemplary band gap profile of an intermediate layer of a multi-layer structure. In the present embodiment, a GaN layer is inserted between an AlGaN layer and an InGaN layer to prevent direct contact between AlGaN layer/InGaN layers.

Referring to FIGS. 13 and 14, the intermediate layer is formed of a structure where an AlGaN layer 110a/GaN layer 110b/InGaN layer 110c/GaN layer 110b stack is repeatedly and periodically deposited. That is, the AlGaN layer 110a/GaN layer 110b/InGaN layer 110c/GaN layer 110b form one period of the multi-layer structure. Particularly, the intermediate layer 110 features a superlattice structure. As shown in FIG. 14, the GaN layer 110b is inserted between the AlGaN layer 110a with a large band gap and the InGaN layer 110c with a small band gap to prevent direct contact between AlGaN layer/InGaN layers. As described above, the intermediate layer of the third embodiment serves to block crystal defects and increase ESD resistance. Notably, the GaN layer 110b is inserted between the AlGaN layer 110a and the InGaN layer 110c to more effectively relieve stress resulting from lattice mismatch between the AlGaN layer 110a and the InGaN layer 110c. Of course, the intermediate layer may be modulation doped for mobility modulation or In-doped as described above.

Fourth Embodiment

Figure 15:
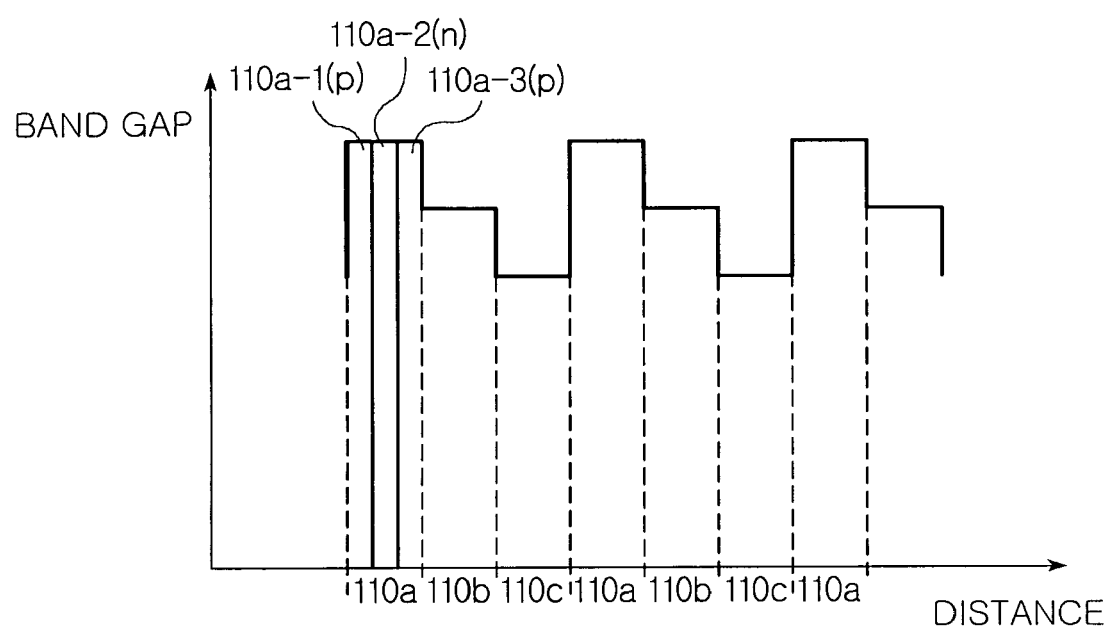
FIG. 15 is a graph illustrating a band gap profile of an intermediate layer of a multi-layer structure according to a fourth embodiment of the invention.

FIG. 15 is a graph illustrating a band gap profile of an intermediate layer of a multi-layer structure according to a fourth embodiment of the invention. In the present embodiment, a corresponding one of constituent layers, e.g., an AlGaN layer 110a, of an AlGaN layer 110a/GaN layer 110b/InGaN layer 110c stack is modulation doped inside. As shown in FIG. 15, the AlGaN layer 110a is modulation doped into p-AlGaN layer 110a-1, n-AlGaN layer 110a-2 and p-AlGaN layer 110a-3. Modulation doping inside the corresponding one of the constituent layers of the intermediate layer allows current to spread laterally, thereby leading to better ESD resistance. The other ones of the constituent layers, e.g., GaN layer 110b or InGaN layer 110c may be modulation doped inside. The corresponding one of the constituent layers may be modulation doped inside, and also the AlGaN layer 110a/GaN layer 110b/InGaN layer 110c stack may be modulation doped in a deposition direction.

As set forth above, according to exemplary embodiments of the invention, an intermediate layer of a multi-layer structure is employed to reduce crystal defect density of a nitride semiconductor and improve ESD resistance. Moreover, an AlGaN layer/GaN layer/InGaN layer stack or InGaN layer/GaN layer/AlGaN layer stack is modulation doped for mobility modulation to additionally increase ESD resistance. This accordingly enhances brightness and reliability of a light emitting device.

While the present invention has been shown and described in connection with the exemplary embodiments, it will be apparent to those skilled in the art that modifications and variations can be made without departing from the spirit and scope of the invention as defined by the appended claims.

What is claimed is:

1. A nitride semiconductor light emitting device comprising:
   an n-type semiconductor region;
   an active layer formed on the n-type semiconductor region;
   a p-type semiconductor region formed on the active layer;
   an n-electrode disposed in contact with the n-type semiconductor region;
   a p-electrode formed on the p-type semiconductor region; and
   at least one intermediate layer formed in at least one of the n-type semiconductor region and the p-type semiconductor region, the intermediate layer disposed above the n-electrode,
   wherein the intermediate layer is formed of a multi-layer structure where at least three layers with different band gaps from one another are deposited,
   the multi-layer structure comprises one of an AlGaN layer/GaN layer/InGaN layer stack and an InGaN layer/GaN layer/AlGaN layer stack, and
   at least two of the AlGaN layer, the GaN layer and InGaN layer have a different concentration of dopant or a different doping type from one another.

2. The nitride semiconductor light emitting device of claim 1, wherein the intermediate layer is formed of a multi-layer structure where one of the AlGaN layer/GaN layer/InGaN layer stack and the InGaN layer/GaN layer/AlGaN layer stack is deposited repeatedly.

3. The nitride semiconductor light emitting device of claim 1, wherein the intermediate layer is formed of a superlattice structure where one of the AlGaN layer/GaN layer/InGaN layer stack and the InGaN layer/GaN layer/AlGaN layer stack is deposited repeatedly.

4. The nitride semiconductor light emitting device of claim 1, wherein each of the layers of the intermediate layer has a thickness of 10 to 300 Å.

5. The nitride semiconductor light emitting device of claim 1, wherein the intermediate layer is formed of a multi-layer structure where an AlGaN layer/GaN layer/InGaN layer/GaN layer stack comprises one period and is deposited repeatedly.

6. The nitride semiconductor light emitting device of claim 1, wherein the intermediate layer is formed of a multi-layer structure modulation-doped for mobility modulation.

7. The nitride semiconductor light emitting device of claim 1, wherein in one of the AlGaN layer/GaN layer/InGaN layer stack and the InGaN layer/GaN layer/AlGaN layer stack, the AlGaN layer, the GaN layer, and InGaN layer are doped to a different concentration or with a different doping type from one another.

8. The nitride semiconductor light emitting device of claim 7, wherein in the one of the AlGaN layer/GaN layer/InGaN layer stack and the InGaN layer/GaN layer/AlGaN layer stack, the AlGaN layer is doped with a first conductivity, the GaN layer is undoped and the InGaN layer is doped with a second conductivity.

9. The nitride semiconductor light emitting device of claim 7, wherein in the one of the AlGaN layer/GaN layer/InGaN layer stack and the InGaN layer/GaN layer/AlGaN layer stack, the AlGaN layer is one of p-doped and undoped, the GaN layer is n-doped and the InGaN layer is undoped.

10. The nitride semiconductor light emitting device of claim 1, wherein in the one of the AlGaN layer/GaN layer/InGaN layer stack and the InGaN layer/GaN layer/AlGaN layer stack, the inside of at least one of the AlGaN layer, GaN layer and InGaN layer is modulation-doped.

11. The nitride semiconductor light emitting device of claim 10, wherein in the one of the AlGaN layer/GaN layer/InGaN layer stack and the InGaN layer/GaN layer/AlGaN layer stack, at least one of the AlGaN layer, GaN layer and InGaN layer is formed of a modulation-doped structure having one of a p-type layer/n-type layer/p-type layer stack and an n-type layer/p-type layer/n-type layer stack.

12. The nitride semiconductor light emitting device of claim 1, wherein the intermediate layer is at least partially In-doped.

13. The nitride semiconductor light emitting device of claim 1, wherein the nitride semiconductor light emitting device comprises a light emitting diode where the n-electrode and the p-electrode are positioned on the same side of the light emitting diode.

14. The nitride semiconductor light emitting device of claim 13, further comprising a substrate disposed below the n-type semiconductor region.

15. The nitride semiconductor light emitting device of claim 1, wherein the nitride semiconductor light emitting device comprises a light emitting diode where the n-electrode is formed on an opposing side of the p-electrode.

16. The nitride semiconductor light emitting device of claim 15, further comprising a conductive substrate, wherein the n-type semiconductor region is interposed between the active layer and the conductive substrate.

17. The nitride semiconductor light emitting device of claim 15, further comprising a conductive substrate wherein the p-type semiconductor region is interposed between the active layer and the conductive substrate.

18. The nitride semiconductor light emitting device of claim 14, wherein the substrate has a top surface defining a crystal plane for non-polar GaN layer growth.

19. The nitride semiconductor light emitting device of claim 16, wherein the conductive substrate has a top surface defining a crystal plane for non-polar GaN layer growth.

20. The nitride semiconductor light emitting device of claim 17, wherein the conductive substrate has a top surface defining a crystal plane for non-polar GaN layer growth.

21. The nitride semiconductor light emitting device of claim 14, wherein the substrate comprises one of a-plane sapphire, r-plane sapphire, m-plane sapphire, SiC, $LiAlO_2$, ZnO and m-plane GaN.

22. The nitride semiconductor light emitting device of claim 16, wherein the conductive substrate comprises one of SiC, ZnO and m-plane GaN.

23. The nitride semiconductor light emitting device of claim 17, wherein the conductive substrate comprises one of SiC, ZnO and m-plane GaN.

* * * * *